(12) United States Patent
Shimizu

(10) Patent No.: US 9,131,625 B2
(45) Date of Patent: Sep. 8, 2015

(54) MULTILAYER CERAMIC ELECTRONIC COMPONENT, SERIES OF ELECTRONIC COMPONENTS STORED IN A TAPE, AND METHOD OF MANUFACTURING MULTILAYER CERAMIC ELECTRONIC COMPONENT

(71) Applicant: Murata Manufacturing Co., Ltd., Nagaokakyo-shi, Kyoto-fu (JP)

(72) Inventor: Kotaro Shimizu, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/520,388

(22) Filed: Oct. 22, 2014

(65) Prior Publication Data
US 2015/0114703 A1    Apr. 30, 2015

(30) Foreign Application Priority Data

Oct. 24, 2013  (JP) .................................. 2013-220932
Aug. 26, 2014  (JP) .................................. 2014-171098

(51) Int. Cl.
| | | |
|---|---|---|
| *H05K 1/18* | (2006.01) | |
| *H01G 4/30* | (2006.01) | |
| *H01G 4/012* | (2006.01) | |
| *H01G 4/12* | (2006.01) | |
| *H01G 4/248* | (2006.01) | |
| *H01F 27/28* | (2006.01) | |
| *H01L 41/047* | (2006.01) | |
| *H01C 7/00* | (2006.01) | |
| *H01C 1/148* | (2006.01) | |
| *H01C 17/00* | (2006.01) | |
| *H01L 41/22* | (2013.01) | |
| *H01F 41/32* | (2006.01) | |
| *H01G 13/00* | (2013.01) | |
| *H01F 5/00* | (2006.01) | |

(52) U.S. Cl.
CPC ................ *H05K 1/185* (2013.01); *H01C 1/148* (2013.01); *H01C 7/008* (2013.01); *H01C 17/00* (2013.01); *H01F 5/00* (2013.01); *H01F 27/2804* (2013.01); *H01F 41/32* (2013.01); *H01G 4/012* (2013.01); *H01G 4/1209* (2013.01); *H01G 4/248* (2013.01); *H01G 4/30* (2013.01); *H01G 13/00* (2013.01); *H01L 41/0472* (2013.01); *H01L 41/0477* (2013.01); *H01L 41/22* (2013.01); *H01F 2027/2809* (2013.01)

(58) Field of Classification Search
CPC ........................ H01F 5/00; H01F 27/00–27/30
USPC ............... 336/65, 83, 200, 232, 192; 174/260
See application file for complete search history.

(56) References Cited

FOREIGN PATENT DOCUMENTS

JP          09-082558 A      3/1997

*Primary Examiner* — Tuyen Nugyen
(74) *Attorney, Agent, or Firm* — Keating & Bennett, LLP

(57) ABSTRACT

In a multilayer ceramic electronic component, a size of a step portion on a first main surface and a size of a step portion on a second main surface are different from each other. A first outer electrode includes a plating film containing Cu. A length of a portion of the plating film containing Cu that is positioned on the first main surface in a length direction and a length of a portion of the plating film containing Cu that is positioned on the second main surface in the length direction are different from each other.

18 Claims, 5 Drawing Sheets

MULTILAYER CERAMIC ELECTRONIC COMPONENT, SERIES OF ELECTRONIC COMPONENTS STORED IN A TAPE, AND METHOD OF MANUFACTURING MULTILAYER CERAMIC ELECTRONIC COMPONENT

BACKGROUND OF THE INVENTION

1. Field of the Invention

The present invention relates to a multilayer ceramic electronic component, a series of electronic components stored in a tape, and a method of manufacturing a multilayer ceramic electronic component.

2. Description of the Related Art

In the related art, a multilayer ceramic electronic component that includes first inner electrodes and second inner electrodes that are alternately disposed in a thickness direction has been used in various devices. In such a multilayer ceramic electronic component, the first and second inner electrodes are not disposed across the entire multilayer ceramic electronic component. Thus, there is a difference in thickness between a portion in which the first and second inner electrodes are disposed and the other portions. A protruding portion is generally formed on one main surface of the multilayer ceramic electronic component due to the difference in thickness (see, for example, Japanese Unexamined Patent Application Publication No. 9-82558).

When a multilayer ceramic electronic component is mounted on a mounting substrate, the multilayer ceramic electronic component may sometimes become damaged. In particular, in the case where a protruding portion is present on a main surface of a multilayer ceramic electronic component, when the multilayer ceramic electronic component is mounted on a mounting substrate in such a manner that the main surface of the multilayer ceramic electronic component on which the protruding portion is present and the mounting substrate face each other, a stress is concentrated at an interface between outer electrodes and a main body of the multilayer ceramic electronic component while the protruding portion serves as a fulcrum, and as a result, the probability of the main body of the multilayer ceramic electronic component becoming damaged increases.

SUMMARY OF THE INVENTION

Accordingly, preferred embodiments of the present invention significantly reduces or prevents damage to a multilayer ceramic electronic component at the time of mounting the multilayer ceramic electronic component.

According to a preferred embodiment of the present invention, a multilayer ceramic electronic component includes a ceramic element body, first and second inner electrodes, a first outer electrode, and a second outer electrode. The ceramic element body includes first and second main surfaces, first and second side surfaces, and first and second end surfaces. The first and second main surfaces extend in a length direction and a width direction. The first and second side surfaces extend in the length direction and a thickness direction. The first and second end surfaces extend in the width direction and the thickness direction. The first and second inner electrodes are alternately disposed within the ceramic element body in the thickness direction. The first and second inner electrodes are not positioned at an end portion of the ceramic element body in the width direction. The first outer electrode is electrically connected to the first inner electrodes. The first outer electrode extends from the first end surface to the first and second main surfaces. The second outer electrode is electrically connected to the second inner electrodes. The second outer electrode extends from the second end surface to the first and second main surfaces. The size of a step portion on the first main surface and the size of a step portion on the second main surface are different from each other. The first outer electrode includes a plating film containing Cu. The length of a portion of the plating film containing Cu that is positioned on the first main surface in the length direction and the length of a portion of the plating film containing Cu that is positioned on the second main surface in the length direction are different from each other.

In the multilayer ceramic electronic component according to a preferred embodiment of the present invention, the size of the step portion on the second main surface preferably is smaller than the size of the step portion on the first main surface. In this case, it is preferable that the length of the portion of the plating film containing Cu that is positioned on the second main surface in the length direction be larger than the length of the portion of the plating film containing Cu that is positioned on the first main surface in the length direction. It is preferable that the distance between the first outer electrode and the second outer electrode on the second main surface in the length direction be smaller than the distance between the first outer electrode and the second outer electrode on the first main surface in the length direction.

It is preferable that the size of the step portion on the second main surface be about 0.2 to about 0.3 times the size of the step portion on the first main surface.

According to another preferred embodiment of the present invention, a series of taped electronic components includes a tape and multilayer ceramic electronic components. The tape includes a carrier tape that has an elongated or substantially elongated shape and a cover tape. A plurality of recesses are provided in the carrier tape in a longitudinal direction. The cover tape is arranged on the carrier tape so as to cover the plurality of recesses. Each of the multilayer ceramic electronic components is disposed in a corresponding one of the plurality of recesses. Each of the multilayer ceramic electronic components includes a ceramic element body, first and second inner electrodes, a first outer electrode, and a second outer electrode. The ceramic element body includes first and second main surfaces, first and second side surfaces, and first and second end surfaces. The first and second main surfaces extend in a length direction and a width direction. The first and second side surfaces extend in the length direction and a thickness direction. The first and second end surfaces extend in the width direction and the thickness direction. The first and second inner electrodes are alternately disposed within the ceramic element body in the thickness direction. The first and second inner electrodes are not positioned at an end portion of the ceramic element body in the width direction. The first outer electrode is electrically connected to the first inner electrodes. The first outer electrode extends from the first end surface to the first and second main surfaces. The second outer electrode is electrically connected to the second inner electrodes. The second outer electrode extends from the second end surface to the first and second main surfaces. The size of a step portion on each of the second main surfaces is smaller than the size of a step portion on a corresponding one of the first main surfaces. Each of the first outer electrodes includes a plating film containing Cu. The length of a portion of each of the plating films containing Cu that is positioned on the corresponding second main surface in the length direction is larger than the length of a portion of the plating film containing Cu that is positioned on the corresponding first main surface in the length direction. The multilayer ceramic electronic components are disposed in the corresponding recesses such that the second main surfaces of the multilayer ceramic electronic components face bottom surfaces of the corresponding recesses.

According to a further preferred embodiment of the present invention, in a method of manufacturing a multilayer ceramic electronic component, a first conductive paste layer that is used for forming a first outer electrode is formed by dipping a ceramic element body into a conductive paste from a first end surface side in a state where a first or second main surface of the ceramic element body is inclined with respect to a vertical direction.

In various preferred embodiments of the present invention, damage to a multilayer ceramic electronic component at the time of mounting the multilayer ceramic electronic component is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
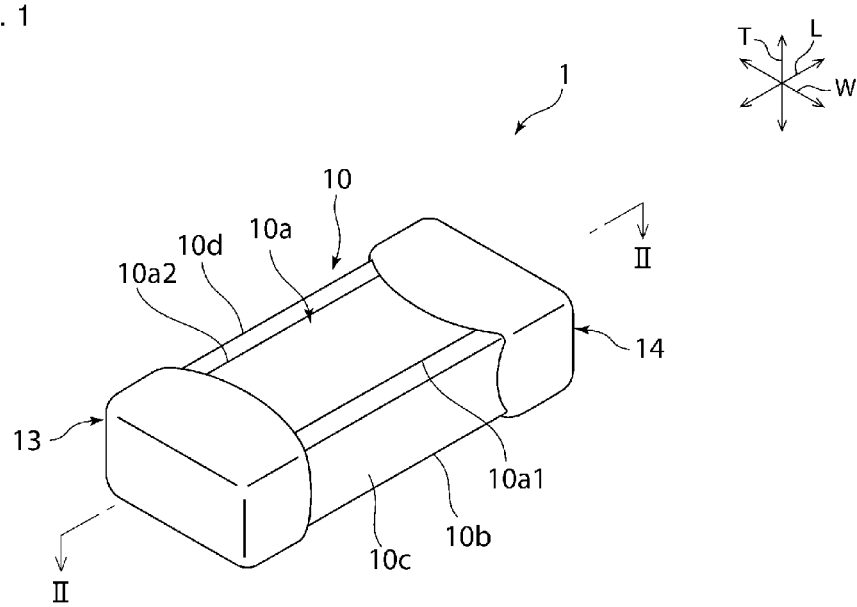
FIG. 1 is a schematic perspective view of a multilayer ceramic electronic component according to a preferred embodiment of the present invention.

Examples of preferred embodiments of the present invention will be described below. However, the following preferred embodiments are merely examples. The present invention is in no way limited to the following preferred embodiments.

In the drawings that will be referred to in the description of the preferred embodiments and so forth, members that have the same or substantially the same functions are referred to by the same reference numerals. In addition, the drawings that will be referred to in the description of preferred embodiments and so forth are schematically illustrated. Dimensional ratios and so forth of objects that are illustrated in the drawings may sometimes be different from dimensional ratios and so forth of actual objects. The dimensional ratios and so forth of the objects may also sometimes differ between the drawings. The specific dimensional ratios and so forth of the objects should be determined by taking the following description into consideration.

Figure 2:
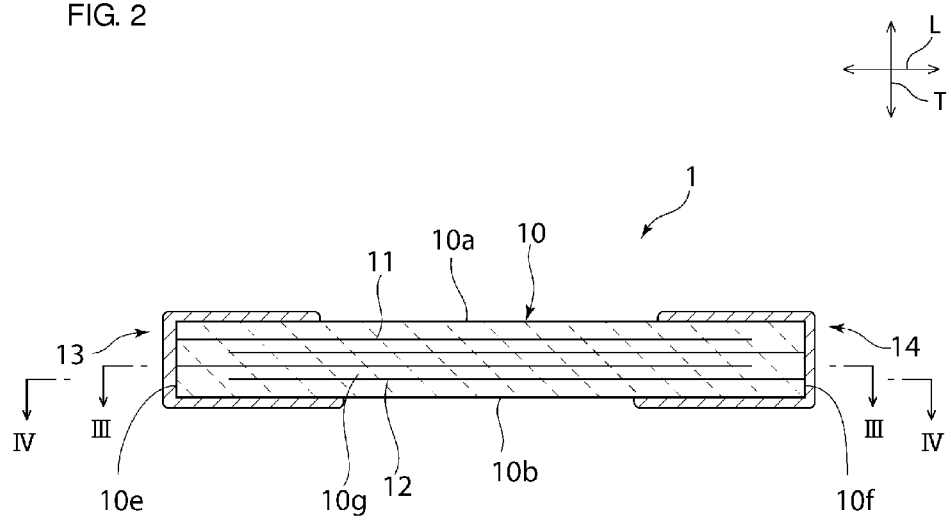
FIG. 2 is a schematic sectional view taken along line II-II of FIG. 1.
Figure 3:
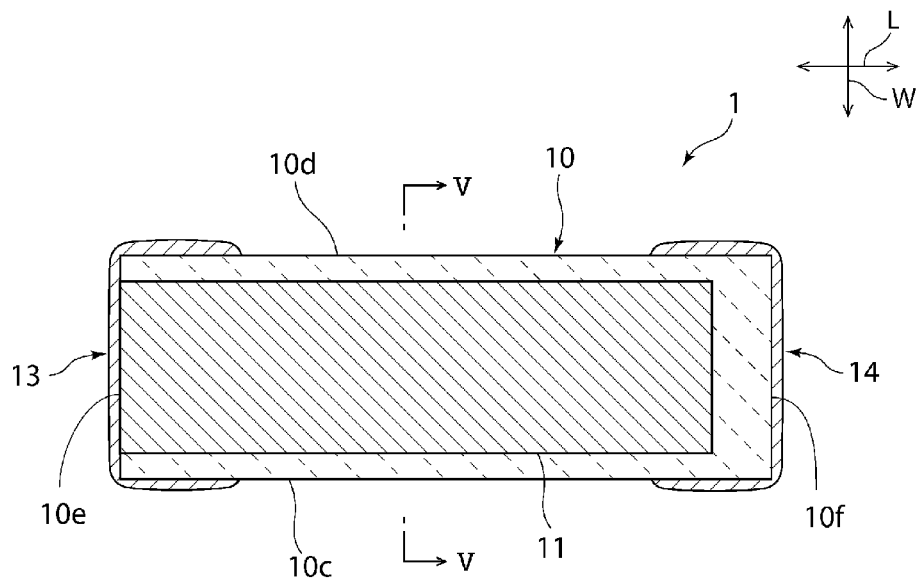
FIG. 3 is a schematic sectional view taken along line III-III of FIG. 2.
Figure 4:
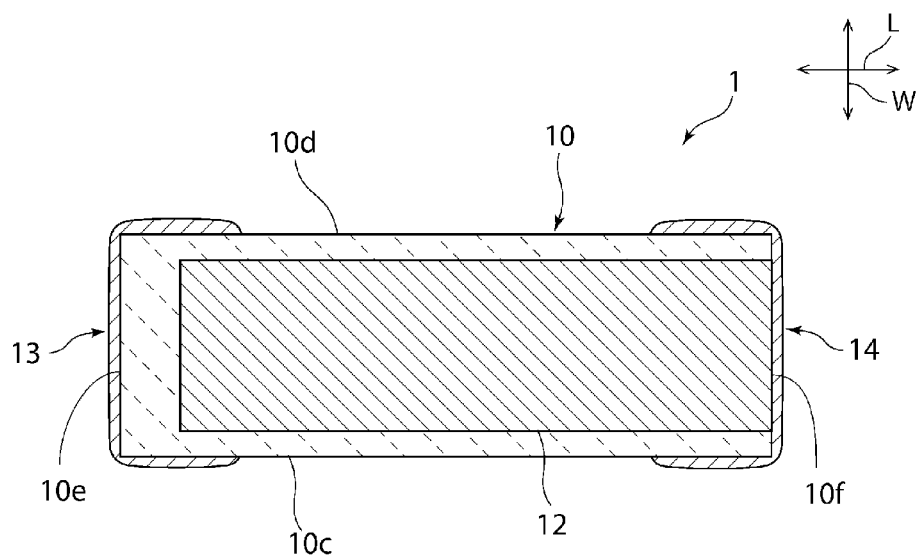
FIG. 4 is a schematic sectional view taken along line IV-IV of FIG. 2.
Figure 5:
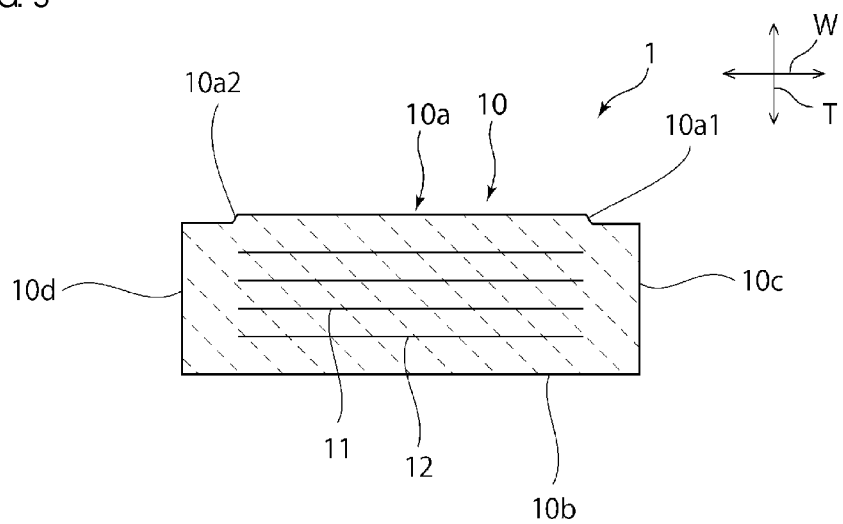
FIG. 5 is a schematic sectional view taken along line V-V of FIG. 3.
Figure 6:
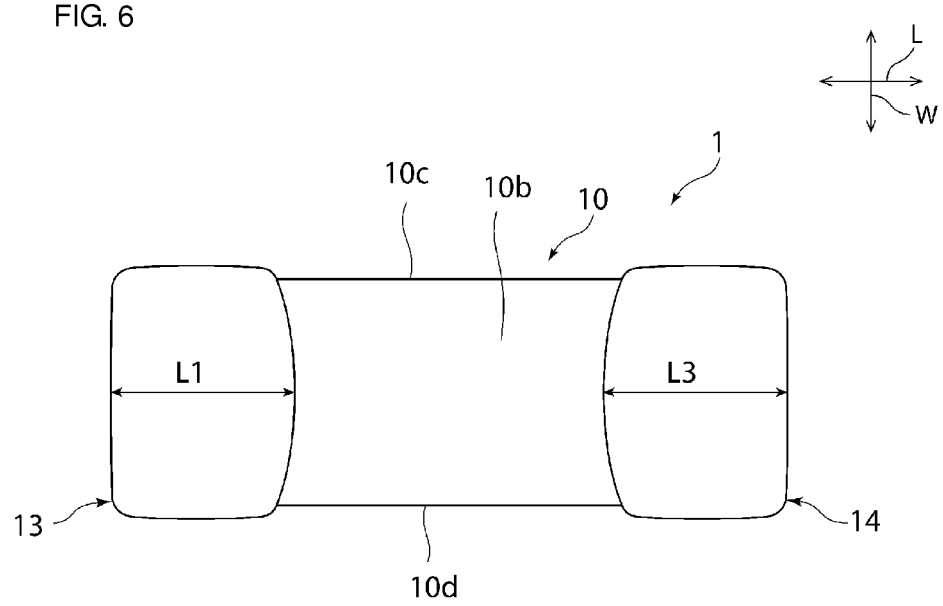
FIG. 6 is a schematic bottom view of the multilayer ceramic electronic component according to a preferred embodiment of the present invention.
Figure 7:
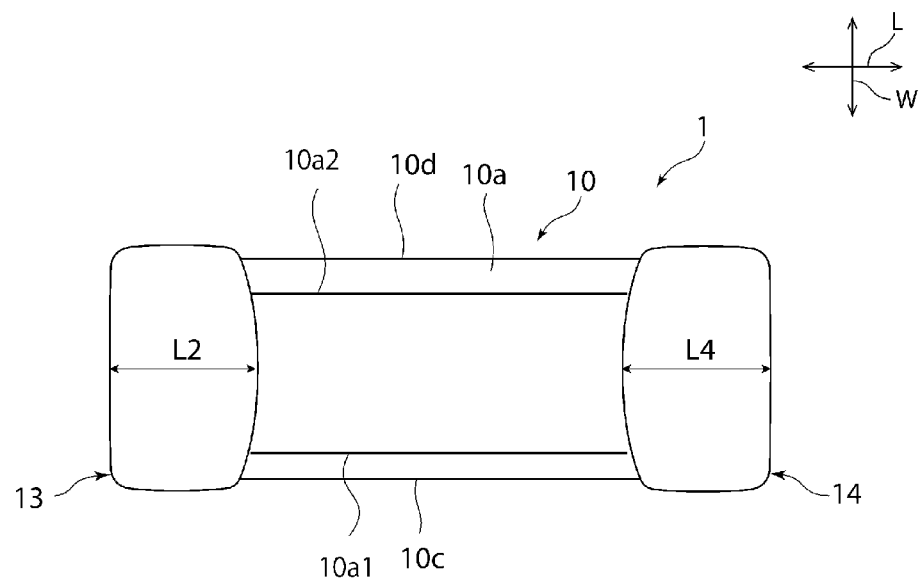
FIG. 7 is a schematic plan view of the multilayer ceramic electronic component according to a preferred embodiment of the present invention.

FIG. 1 is a schematic perspective view of a multilayer ceramic electronic component 1 according to the present preferred embodiment. FIG. 2 is a schematic sectional view taken along line II-II of FIG. 1. FIG. 3 is a schematic sectional view taken along line III-III of FIG. 2. FIG. 4 is a schematic sectional view taken along line IV-IV of FIG. 2. FIG. 5 is a schematic sectional view taken along line V-V of FIG. 3. FIG. 6 is a schematic bottom view of the multilayer ceramic electronic component 1 according to the present preferred embodiment. FIG. 7 is a schematic plan view of the multilayer ceramic electronic component 1 according to the present preferred embodiment.

The multilayer ceramic electronic component 1 illustrated in FIG. 1 to FIG. 7 may be a ceramic capacitor or may be a piezoelectric component, a thermistor, an inductor, or the like.

The multilayer ceramic electronic component 1 includes a ceramic element body 10 that preferably has a rectangular or substantially rectangular parallelepiped shape. The ceramic element body 10 includes a first main surface 10a, a second main surface 10b, a first side surface 10c, a second side surface 10d, a first end surface 10e, and a second end surface 10f (see FIG. 2 to FIG. 4). The first main surface 10a and the second main surface 10b extend in a length direction L and a width direction W. The first side surface 10c and the second side surface 10d extend in the length direction L and a thickness direction T. The first end surface 10e and the second end surface 10f extend in the width direction W and the thickness direction T. The length direction L, the width direction W, and the thickness direction T are perpendicular to one another.

Note that, in the present invention, the term "substantially rectangular parallelepiped shape" includes a rectangular parallelepiped shape including a corner portion and a ridgeline portion that are rounded. In other words, members that have a "substantially rectangular parallelepiped shape" means members in general that include first and second main surfaces, first and second side surfaces, and first and second end surfaces. In addition, projections, depressions, and the like may be provided on and in portions of or over the entire main surfaces, side surfaces, and end surfaces.

The dimensions of the ceramic element body 10 are not particularly limited. It is preferable that the length dimension of the ceramic element body 10 be about 0.6 mm to about 1.05 mm, for example. It is preferable that the width dimension of the ceramic element body 10 be about 0.3 mm to about 0.55 mm, for example. It is preferable that the thickness dimension of the ceramic element body 10 be about 0.07 mm to about 0.25 mm, for example. It is preferable that the ratio of the length dimension of the ceramic element body 10 to the thickness dimension of the ceramic element body 10 (length dimension of ceramic element body 10:thickness dimension of ceramic element body 10) be about 0.6:about 0.07 to about 1.05:about 0.15, for example.

The ceramic element body 10 is made of an appropriate ceramic corresponding to functionality of the multilayer ceramic electronic component 1. More specifically, in the case where the multilayer ceramic electronic component 1 is a capacitor, the ceramic element body 10 can be made of a dielectric ceramic. Specific examples of the dielectric ceramic include, for example, $BaTiO_3$, $CaTiO_3$, $SrTiO_3$, and $CaZrO_3$. Subcomponents such as, for example, a Mn compound, a Mg compound, a Si compound, an Fe compound, a Cr compound, a Co compound, a Ni compound, and a rare earth compound may be suitably added to the ceramic element body 10 in accordance with required characteristics for the multilayer ceramic electronic component 1.

In the case where the multilayer ceramic electronic component 1 is a piezoelectric component, the ceramic element body 10 can be made of a piezoelectric ceramic. Specific examples of the piezoelectric ceramic include, for example, a lead zirconate titanate (PZT)-based ceramic.

In the case where the multilayer ceramic electronic component 1 is, for example, a thermistor, the ceramic element body 10 can be made of a semiconductor ceramic. Specific examples of the semiconductor ceramic include, for example, a spinel-based ceramic.

In the case where the multilayer ceramic electronic component 1 is, for example, an inductor, the ceramic element body 10 can be made of a magnetic ceramic. Specific examples of the magnetic ceramic include, for example, a ferrite ceramic.

As illustrated in FIG. 2 to FIG. 5, a plurality of first inner electrodes 11 and a plurality of second inner electrodes 12 are arranged within the ceramic element body 10.

The first inner electrodes 11 and the second inner electrodes 12 are alternately disposed in the thickness direction T. One of the first inner electrodes 11 and one of the second inner electrodes 12 that are adjacent to each other in the thickness direction T face each other with a ceramic portion 10g interposed therebetween. The thickness of the ceramic portion 10g can be about 0.4 μm to about 0.8 μm and is preferably about 0.3 μm to about 0.5 μm, for example.

Each of the first inner electrodes 11 preferably has a rectangular or substantially rectangular shape. The first inner electrodes 11 are preferably parallel or substantially parallel to the first main surface 10a and the second main surface 10b (see FIG. 1). In other words, the first inner electrodes 11 are arranged along the length direction L and the width direction W. The first inner electrodes 11 are exposed at the first end surface 10e and are not exposed at the first main surface 10a, the second main surface 10b, the first side surface 10c, the second side surface 10d, and the second end surface 10f.

Each of the second inner electrodes 12 preferably has a rectangular or substantially rectangular shape. The second inner electrodes 12 are preferably parallel or substantially parallel to the first main surface 10a and the second main surface 10b (see FIG. 1). In other words, the second inner electrodes 12 are arranged along the length direction L and the width direction W. Thus, the second inner electrodes 12 and the first inner electrodes 11 are parallel or substantially parallel to one another. The second inner electrodes 12 are exposed at the second end surface 10f and are not exposed at the first main surface 10a, the second main surface 10b, the first side surface 10c, the second side surface 10d, and the first end surface 10e. Therefore, the first inner electrodes 11 and the second inner electrodes 12 are not disposed in end portions of the ceramic element body 10 in the width direction W. In other words, the ceramic element body 10 includes portions in each of which the first inner electrodes 11 and the second inner electrodes 12 are not disposed at ends in the width direction W.

There is a difference in thickness between the portion of the ceramic element body 10 in which the first inner electrodes 11 and the second inner electrodes 12 are disposed and the portions of the ceramic element body 10 in which the first inner electrodes 11 and the second inner electrodes 12 are not disposed. The portion of the ceramic element body 10 in which the first inner electrodes 11 and the second inner electrodes 12 are disposed is relatively thick, and the portions of the ceramic element body 10 in which the first inner electrodes 11 and the second inner electrodes 12 are not disposed are relatively thin. Therefore, as illustrated in FIG. 5 and FIG. 6, step portions 10a1 and 10a2 that extend in the length direction L are preferably provided on the first main surface 10a. On the other hand, no step portion is provided on the second main surface 10b in the present preferred embodiment. However, the present invention is not limited to this configuration. Step portions 10b1 and 10b2 may be provided on the second main surface 10b. However, in this case, the sizes of the step portions 10b1 and 10b2 provided on the second main surface 10b are smaller than the respective sizes of the step portions 10a1 and 10a2 provided on the first main surface 10a. It is preferable that the height of each of the step portions 10a1 and 10a2 in the thickness direction T be about 0.03 to about 0.07 times the thickness of the ceramic element body 10, or more preferably, about 0.04 to about 0.07 times the thickness of the ceramic element body 10, for example. In addition, it is preferable that the size of each of the step portions 10b1 and 10b2 on the second main surface 10b be about 0.2 to about 0.3 times the size of a corresponding one of the step portions 10a1 and 10a2 on the first main surface 10a, for example. Note that the heights of the step portions 10a1, 10a2, 10b1, and 10b2 can be calculated by measuring a difference between the first main surface 10a and the step portion 10a1 or the step portion 10a2 or a difference between the second main surface 10b and the step portion 10b1 or the step portion 10b2 that is projected to a polished surface, which is exposed as a result of polishing the first end surface 10e or the second end surface 10f of the multilayer ceramic electronic component 1 to the center in the length direction L, after removing polishing sag on the polished surface.

The first inner electrodes 11 and the second inner electrodes 12 can be made of an appropriate conductive material. The first inner electrodes 11 and the second inner electrodes 12 can be made of, for example, a metal selected from the group consisting of Ni, Cu, Ag, Pd, and Au or an alloy (e.g., Ag—Pd alloy) containing at least one kind of metal selected from the group consisting of Ni, Cu, Ag, Pd, and Au.

It is preferable that the thickness of each of the first inner electrodes 11 and each of the second inner electrodes 12 be, for example, about 0.2 μm to about 2.0 μm, for example.

As illustrated in FIG. 1 and FIG. 2, the multilayer ceramic electronic component 1 includes a first outer electrode 13 and a second outer electrode 14.

The first outer electrode 13 is electrically connected to the first inner electrodes 11 at the first end surface 10e. The first outer electrode 13 is configured to extend from the first end surface 10e to the first main surface 10a, the second main surface 10b, the first side surface 10c, and the second side surface 10d.

On the other hand, the second outer electrode 14 is electrically connected to the second inner electrodes 12 at the second end surface 10f. The second outer electrode 14 is configured to extend from the second end surface 10f to the first main surface 10a, the second main surface 10b, the first side surface 10c, and the second side surface 10d.

The first outer electrode 13 and the second outer electrode 14 each include a plating film containing Cu. Here, the plating film containing Cu includes a plating film that is made of Cu and a plating film that is made of a Cu alloy. The term "plating film containing Cu" will be hereinafter referred to as "Cu plating film".

More specifically, in the present preferred embodiment, the first outer electrode 13 and the second outer electrode 14 each include a fired electrode layer that is located on the ceramic element body 10 and a Cu plating film that is located on the fired electrode layer. Each of the Cu plating films may be defined by a multilayer body that includes a plurality of Cu plating films.

In the present preferred embodiment, the Cu plating films define the outermost layers of the first outer electrode 13 and the second outer electrode 14. The first outer electrode 13 and the second outer electrode 14 do not include a Ni plating film. Here, the term "fired electrode layer" means an electrode layer that is formed by baking a paste containing a conductive material.

When a multilayer ceramic electronic component is mounted on a mounting substrate, the multilayer ceramic electronic component may sometimes become damaged. More specifically, cracks may sometimes be generated in a multilayer ceramic electronic component. As a result of extensive studies, the inventors of the present invention discovered that a multilayer ceramic electronic component was likely to become damaged when the multilayer ceramic electronic component was mounted on a mounting substrate in such a manner that a first main surface on which a large step portion is formed facing the mounting substrate, and that the multilayer ceramic electronic component was less likely to become damaged when the multilayer ceramic electronic component was mounted on the mounting substrate in such a manner that a second main surface that includes a small step portion or substantially does not include a step portion facing the mounting substrate.

Accordingly, in the present preferred embodiment, the lengths L2 and L4 of portions of the Cu plating films, which are included in the first outer electrode 13 and the second outer electrode 14, that are positioned on the first main surface 10a in the length direction L are different from the respective lengths L1 and L3 of portions of the Cu plating films that are positioned on the second main surface 10b in the length direction L. Thus, the orientation of the multilayer ceramic electronic component 1 in the thickness direction T can be determined by measuring the lengths of the portions of the Cu plating films each of which is positioned on one of the first main surface 10a and the second main surface 10b. Accordingly, the multilayer ceramic electronic component 1 can be easily mounted on a mounting substrate in such a manner that the second main surface 10b, which includes a small step portion or substantially does not include a step portion, faces the mounting substrate. Therefore, the multilayer ceramic electronic component 1 is less likely to become damaged at the time of mounting the multilayer ceramic electronic component 1.

From the standpoint of determining the orientation of the multilayer ceramic electronic component 1 in the thickness direction T with higher certainty, it is preferable that the ratio of the lengths (L1 and L3) of the portions of the Cu plating films, which are included in the first outer electrode 13 and the second outer electrode 14, that are positioned on the second main surface 10b in the length direction L to the lengths (L2 and L4) of the portions of the Cu plating films that are positioned on the first main surface 10a in the length direction L (L1/L2 or L3/L4) be about 1.03 or greater or about 1.3 or smaller, or more preferably, about 1.1 or greater or about 1.3 or smaller, for example.

From the standpoint of suppressing, with higher certainty, damage to the multilayer ceramic electronic component 1 at the time of mounting, it is preferable that the lengths L1 and L3 of the portions of the Cu plating films that are positioned on the second main surface 10b, which includes a small step portion or substantially does not include a step portion, in the length direction L be larger than the respective lengths L2 and L4 of the portions of the Cu plating films that are positioned on the first main surface 10a in the length direction L. It is preferable that the lengths L1 and L3 of the portions of the Cu plating films that are positioned on the second main surface 10b in the length direction L be about 1.03 times or more the respective lengths L2 and L4 of the portions of the Cu plating films that are positioned on the first main surface 10a in the length direction L, or more preferably, about 1.1 times or more the respective lengths L2 and L4 of the portions of the Cu plating films, for example. In this case, the distance between the first outer electrode 13 and the second outer electrode 14 on the second main surface 10b in the length direction L may be reduced. Thus, the distance between fulcrums when the multilayer ceramic electronic component 1 is pressed onto the mounting substrate at the time of mounting is reduced. Therefore, damage to the multilayer ceramic electronic component 1 at the time of mounting is more effectively reduced or prevented. It is preferable that the distance between the first outer electrode 13 and the second outer electrode 14 on the second main surface 10b in the length direction L be about 0.55 to about 0.96 times the distance between the first outer electrode 13 and the second outer electrode 14 on the first main surface 10a in the length direction L, or more preferably, about 0.85 to about 0.96 times the distance between the first outer electrode 13 and the second outer electrode 14 on the first main surface 10a in the length direction L, for example.

Note that, in various preferred embodiments of the present invention, the lengths L1 to L4 are values that are measured at the center of the ceramic element body 10 in the thickness direction T.

From the standpoint of being able to distinguish the multilayer ceramic electronic component 1 in the thickness direction T, in each of the first outer electrode 13 and the second outer electrode 14, only the length of a portion of the Cu plating film that is positioned on the first main surface 10a may be different from the length of a portion of the Cu plating film that is positioned on the second main surface 10b.

Figure 8:
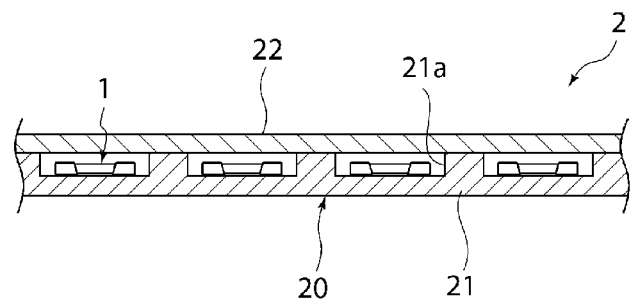
FIG. 8 is a schematic sectional view of a series of taped electronic components according to a preferred embodiment of the present invention.

FIG. 8 is a schematic sectional view of a series of taped electronic components 2 according to another preferred embodiment of the present invention.

As illustrated in FIG. 8, the series of taped electronic components 2 is preferably configured by fixing a plurality of the above-described multilayer ceramic electronic components 1 in place by taping. The series of taped electronic components 2 includes a tape 20 that has an elongated or substantially elongated shape. The tape 20 includes a carrier tape 21 that has an elongated or substantially elongated shape and a cover tape 22 that has an elongated or substantially elongated shape. The carrier tape 21 includes a plurality of recesses 21a that are spaced apart from one another in a longitudinal direction. The cover tape 22 is arranged on the carrier tape 21 so as to cover the plurality of recesses 21a. Each of the multilayer ceramic electronic components 1 is accommodated in a corresponding one of the plurality of recesses 21a. Each of the plurality of multilayer ceramic electronic components 1 is arranged in such a manner that the second main surface 10b thereof faces the bottom surface of the corresponding recess 21a. Thus, each of the plurality of multilayer ceramic electronic components 1 of the series of taped electronic components 2 is suctioned and held on the first main surface 10a side and is mounted such that the second main surface 10b faces a wiring substrate. Therefore, the multilayer ceramic electronic components 1 are less likely to break at the time of mounting.

A method of manufacturing the multilayer ceramic electronic component 1 is not particularly limited. For example, the multilayer ceramic electronic component 1 can be manufactured as follows.

First, the ceramic element body 10 that includes the first inner electrodes 11 and the second inner electrodes 12 is prepared. More specifically, ceramic green sheets are fabricated by applying a ceramic paste containing ceramic powder so as to have a substantially sheet-shaped configuration and drying the ceramic paste by, for example, a screen printing method or the like.

Next, ceramic green sheets on which conductive patterns for use in the formation of inner electrodes have been formed by applying a conductive paste for use in the formation of inner electrodes onto the ceramic green sheets so as to form predetermined patterns by, for example, a screen printing method or the like and ceramic green sheets on which such conductive patterns for use in the formation of inner electrodes are not formed are prepared. Note that, for example, a binder and a solvent, which are commonly known, may be included in the ceramic paste and the conductive paste for use in the formation of inner electrodes.

Then, a predetermined number of the ceramic green sheets on which the conductive patterns for use in the formation of inner electrodes are not formed are stacked on top of one another, the ceramic green sheets on which the conductive patterns for use in the formation of inner electrodes have been formed are sequentially stacked on the ceramic green sheets, and in addition, a predetermined number of the ceramic green sheets on which the conductive patterns for use in the formation of inner electrodes are not formed are stacked on top of one another, so that a mother multilayer body is fabricated. Note that the mother multilayer body may be pressed in a stacking direction by a method such as isostatic pressing as may be necessary.

The mother multilayer body is cut in such a manner as to have a predetermined shape and predetermined dimensions, so that a plurality of raw ceramic element bodies are fabricated. In this case, barrel grinding or the like may be performed on each of the raw ceramic element bodies in such a manner as to round ridgeline portions and corner portions of the raw ceramic element bodies.

After that, each of the raw ceramic element bodies is fired. As a result, the ceramic element bodies 10 are completed. Note that the temperature at which the raw ceramic element bodies are fired may be suitably set in accordance with the ceramic and the conductive material that are used. The temperature at which the raw ceramic element bodies are fired can be set to, for example, about 900° C. to about 1,300° C.

Next, first and second fired electrode layers are formed by applying a conductive paste onto end surfaces of the ceramic element bodies 10, which have been fired, and baking the conductive paste. Note that it is preferable that the baking temperature be, for example, about 700° C. to about 1,000° C.

Figure 9:
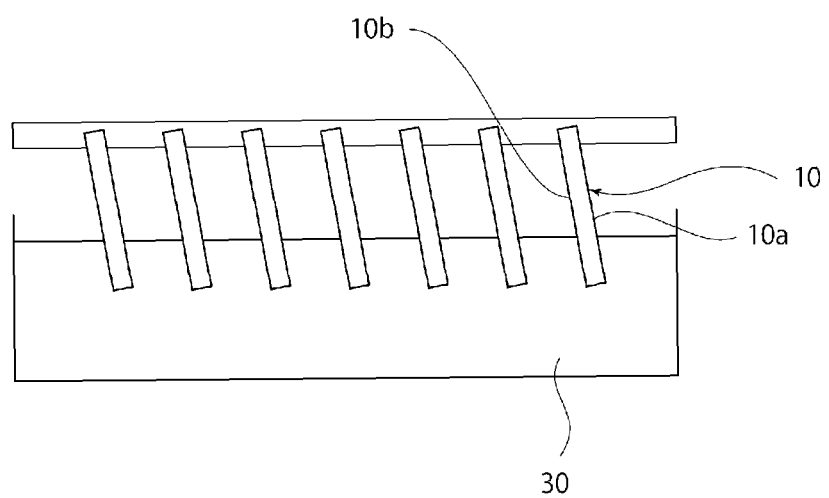
FIG. 9 is a schematic diagram illustrating a process of manufacturing the multilayer ceramic electronic component according to a preferred embodiment of the present invention.

Application of the conductive paste can be performed by, for example, dipping the ceramic element bodies 10 into a chamber filled with the conductive paste (a dipping method). As illustrated in FIG. 9, in the present preferred embodiment, the ceramic element bodies 10 are dipped into a conductive paste chamber 30 while being inclined. More specifically, the ceramic element bodies 10 are dipped into the conductive paste chamber 30 in a state where each of the ceramic element bodies 10 is inclined such that a lower end portion thereof is positioned further toward the first main surface 10a than an upper end portion thereof. Thus, the area of a portion of the second main surface 10b that comes into contact with the conductive paste is larger than the area of a portion of the first main surface 10a that comes into contact with the conductive paste. Therefore, the length of a portion of each of the obtained first and second fired electrode layers that is positioned on the second main surface 10b of the corresponding ceramic element body 10 in the length direction L is larger than the length of a portion of each of the obtained first and second fired electrode layers that is positioned on the first main surface 10a of the corresponding ceramic element body 10 in the length direction L.

Next, a Cu plating film is formed on each of the first and second fired electrode layers, so that the first outer electrode 13 and the second outer electrode 14 can be completed.

As described above, the length of the portion of each of the first and second fired electrode layers that is positioned on the second main surface 10b in the length direction L is larger than the length of the portion of each of the first and second fired electrode layers that is positioned on the first main surface 10a in the length direction L. Therefore, the length of a portion of each of the Cu plating films that is positioned on the second main surface 10b in the length direction L is larger than the length of a portion of the Cu plating film that is positioned on the first main surface 10a in the length direction L.

The multilayer ceramic electronic component 1 can be manufactured in the above manner.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
a ceramic element body including first and second main surfaces extending in a length direction and a width direction, first and second side surfaces extending in the length direction and a thickness direction, and first and second end surfaces extending in the width direction and the thickness direction;
first and second inner electrodes that are alternately disposed within the ceramic element body in the thickness direction and that are not positioned at an end portion of the ceramic element body in the width direction;
a first outer electrode that is electrically connected to the first inner electrodes and extends from the first end surface to the first and second main surfaces; and
a second outer electrode that is electrically connected to the second inner electrodes and extends from the second end surface to the first and second main surfaces; wherein
a size of a step portion on the first main surface and a size of a step portion on the second main surface are different from each other;
the first outer electrode includes a plating film containing Cu; and
a length of a portion of the plating film containing Cu that is positioned on the first main surface in the length direction and a length of a portion of the plating film containing Cu that is positioned on the second main surface in the length direction are different from each other.

2. The multilayer ceramic electronic component according to claim 1, wherein
the size of the step portion on the second main surface is smaller than the size of the step portion on the first main surface; and
the length of the portion of the plating film containing Cu that is positioned on the second main surface in the length direction is larger than the length of the portion of the plating film containing Cu that is positioned on the first main surface in the length direction.

3. The multilayer ceramic electronic component according to claim 1, wherein the size of the step portion on the second main surface is about 0.2 to about 0.3 times the size of the step portion on the first main surface.

4. The multilayer ceramic electronic component according to claim 2, wherein a distance between the first outer electrode and the second outer electrode on the second main surface in the length direction is smaller than a distance between the first outer electrode and the second outer electrode on the first main surface in the length direction.

5. The multilayer ceramic electronic component according to claim 1, wherein the multilayer ceramic electronic component is one of a ceramic capacitor, a piezoelectric component, a thermistor, and an inductor.

6. The multilayer ceramic electronic component according to claim 1, wherein a length of the ceramic element body is about 0.6 mm to about 1.05 mm.

7. The multilayer ceramic electronic component according to claim 1, wherein a width of the ceramic element body is about 0.3 mm to about 0.55 mm.

8. The multilayer ceramic electronic component according to claim 1, wherein a thickness of the ceramic element body is about 0.07 mm to about 0.25 mm.

9. The multilayer ceramic electronic component according to claim 1, wherein a ratio of a length of the ceramic element body to a thickness of the ceramic element body is about 0.6:about 0.07 to about 1.05:about 0.15.

10. The multilayer ceramic electronic component according to claim 1, wherein a height of each of the first and second step portions in the thickness direction is about 0.03 to about 0.07 times a thickness of the ceramic element body.

11. The multilayer ceramic electronic component according to claim 1, wherein a height of each of the first and second step portions in the thickness direction is about 0.04 to about 0.07 times a thickness of the ceramic element body.

12. The multilayer ceramic electronic component according to claim 1, wherein at least one of the first outer electrode and the second outer electrode includes a fired electrode layer and at least one Cu plating film located on the fired electrode layer.

13. The multilayer ceramic electronic component according to claim 1, wherein each of the first and second outer electrodes include at least one Cu plating film, and a ratio of lengths of portions of the Cu plating films that are positioned on the second main surface in the length direction to lengths of portions of the Cu plating films that are positioned on the first main surface in the length direction is about 1.03 or greater or about 1.3 or smaller.

14. The multilayer ceramic electronic component according to claim 1, wherein each of the first and second outer electrodes include at least one Cu plating film, and a ratio of lengths of portions of the Cu plating films that are positioned on the second main surface in the length direction to lengths of portions of the Cu plating films that are positioned on the first main surface in the length direction is about 1.1 or greater or about 1.3 or smaller.

15. The multilayer ceramic electronic component according to claim 1, wherein a distance between the first outer electrode and the second outer electrode on the second main surface in the length direction is about 0.55 to about 0.96 times a distance between the first outer electrode and the second outer electrode on the first main surface in the length direction.

16. The multilayer ceramic electronic component according to claim 1, wherein a distance between the first outer electrode and the second outer electrode on the second main surface in the length direction is about 0.85 to about 0.96 times a distance between the first outer electrode and the second outer electrode on the first main surface in the length direction.

17. A series of electronic components stored in a tape comprising:
a tape including a carrier tape that has an elongated or substantially elongated shape and in which a plurality of recesses are provided in a longitudinal direction and a cover tape that is arranged on the carrier tape so as to cover the plurality of recesses; and
multilayer ceramic electronic components each of which is disposed in a corresponding one of the plurality of recesses; wherein
each of the multilayer ceramic electronic components includes:
a ceramic element body including first and second main surfaces extending in a length direction and a width direction, first and second side surfaces extending in the length direction and a thickness direction, and first and second end surfaces extending in the width direction and the thickness direction;
first and second inner electrodes that are alternately disposed within the ceramic element body in the thickness direction and that are not positioned at an end portion of the ceramic element body in the width direction;
a first outer electrode that is electrically connected to the first inner electrodes and extends from the first end surface to the first and second main surfaces; and
a second outer electrode that is electrically connected to the second inner electrodes and extends from the second end surface to the first and second main surfaces; wherein
a size of a step portion on each of the second main surfaces is smaller than a size of a step portion on a corresponding one of the first main surfaces;
each of the first outer electrodes includes a plating film containing Cu;
a length of a portion of each of the plating films containing Cu that is positioned on the corresponding second main surface in the length direction is larger than a length of a portion of the plating film containing Cu that is positioned on the corresponding first main surface in the length direction; and
the multilayer ceramic electronic components are disposed in the corresponding recesses in such a manner that the second main surfaces of the multilayer ceramic electronic components face bottom surfaces of the corresponding recesses.

18. A method of manufacturing the multilayer ceramic electronic component according to claim 1, the method comprising:
forming a first conductive paste layer that is used to form the first outer electrode by dipping the ceramic element body into a conductive paste from a first end surface side in a state where the first main surface or the second main surface of the ceramic element body is inclined with respect to a vertical direction.

* * * * *